US007489201B2

(12) United States Patent  (10) Patent No.: US 7,489,201 B2
Sarkar et al.  (45) Date of Patent: Feb. 10, 2009

(54) MILLIMETER-WAVE CASCODE AMPLIFIER GAIN BOOSTING TECHNIQUE

(75) Inventors: Saikat Sarkar, Atlanta, GA (US);
Padmanava Sen, Atlanta, GA (US);
Stephane Pinel, Atlanta, GA (US); Joy Laskar, Marietta, GA (US)

(73) Assignee: Georgia Tech Research Corp., Atlanta, GA (US)

( * ) Notice: Subject to any disclaimer, the term of this patent is extended or adjusted under 35 U.S.C. 154(b) by 64 days.

(21) Appl. No.: 11/801,363

(22) Filed: May 9, 2007

(65) Prior Publication Data

US 2007/0273445 A1  Nov. 29, 2007

Related U.S. Application Data

(60) Provisional application No. 60/799,175, filed on May 10, 2006.

(51) Int. Cl.
*H03F 3/04* (2006.01)
(52) U.S. Cl. ......................................... 330/311; 330/310
(58) Field of Classification Search .................. 330/311, 330/310, 124 R, 295, 302
See application file for complete search history.

(56) References Cited

U.S. PATENT DOCUMENTS

| | | | | |
|---|---|---|---|---|
| 3,805,164 A | * | 4/1974 | Callaway | 455/291 |
| 3,836,873 A | * | 9/1974 | Healey et al. | 331/116 R |
| 3,868,606 A | * | 2/1975 | Driscoll | 331/175 |
| 4,586,004 A | * | 4/1986 | Valdez | 330/300 |
| 5,530,405 A | * | 6/1996 | Rydel | 330/278 |
| 6,864,750 B2 | * | 3/2005 | Shigematsu | 330/311 |
| 7,345,548 B2 | * | 3/2008 | Rivoirard et al. | 330/311 |
| 7,378,912 B2 | * | 5/2008 | Tanahashi et al. | 330/311 |

OTHER PUBLICATIONS

K. Lai, et al., "A high performance and low DC power V-band MIMIC LNA using 0.1 μm InGaAs/InAlAs/InP HEMT technology,".
IEEE Microwave and Guided Wave Letters, vol. 3, No. 12, pp. 447-449, Dec. 1993.
K. Niahikawa, et al., "Compact LNA and VCO 3-D MMICs using commercial GaAs PHEMT technology for V-band single-chip TRX MMIC,".
IEEE International Microwave Symposium, pp. 1717-1720, Jun. 2002, Seattle, WA.
J. D. Cressler, in "SiGe HBT technology: a new contender for Si-based RE and microwave circuit applications,".

(Continued)

*Primary Examiner*—Henry K Choe
(74) *Attorney, Agent, or Firm*—Kenneth W. Float

(57) ABSTRACT

Disclosed is a gain boosting technique for use with millimeter-wave cascode amplifiers. The exemplary technique may be implemented using a 0.18 μm SiGe process ($F_T$=140 GHz). It has also been shown that the technique is effective for CMOS processes with comparable $F_T$. An exemplary gain-enhanced cascode stage was measured to have higher than 9 dB gain with a 1-dB bandwidth above 6 GHz with a DC power consumption of 13 mW. In addition, one cascode stage without gain boosting may be cascaded with two gain-boosted cascode amplifier stages to implement a three-stage LNA. The measured stable gain is higher than 24 dB at 60 GHz with a 3-dB bandwidth of 3.1 GHz for 25 mW of DC power consumption. It is believed that this is the first 60 GHz LNA with a higher than 20 dB gain using a 0.18 μm SiGe process.

20 Claims, 14 Drawing Sheets

OTHER PUBLICATIONS

IEEE Trans. Microwave Theory & Tech., vol. 46, No. 5, pp. 572-589, May 1998.

S. K. Reynolds, "A 60GHz superheterodyne downconversion mixer in silicon-,germanium bipolar technology,".

IEEE Journal of Solid State Circuits, vol. 39, No. 11, pp. 2065-2068, Nov. 2004.

C. H. Doan, et al., "Millimeter-Wave CMOS Design," IEEE Journal of Solid State Circuits, vol. 40, No. 1, pp. 144-155, Jan. 2005.

M. Lo, et al., "A Miniature V-band 3-Stage Cascode LNA in 0.13 μm CMOS," IEEE Solid State Circuits Conference, pp. 322-323, Feb. 2006, San Francisco, CA.

C. H. Wang, et al., "A 60GHz Transmitter with Integrated Antenna in 0.18 μm SiGe BiCMOS Technology," IEEE Solid State Circuits Conference, pp. 186-187, Feb. 2006, San Francisco.

D. J. Allstot, et al., "Design Considerations for CMOS Low-Noise Amplifiers," Radio Frequency Integrated Circuits Symposium, pp. 97-100 Jun. 2004, Fort Worth, Tx.

S. Asgaran et al., "A Novel Gain Boosting Technique for Design of Low Power Narrow-Band RFCMOS LNAs," IEEE Northeast Workshop on Circuits and Systems, pp. 293-296 Jun. 2004.

M. Rudolph, et al., "Direct Extraction of HBT Equivalent-Circuit Elements," IEEE Trans. Microwave Theory & Tech., vol. 47, No. 1, pp. 82-84, Jan. 1999.

P. Sen, et al., "A Broadband, Small-Signal SiGe HBT Model for Millimeter-Wave Applications,".

European GaAs and other Compound Semiconductors Application Symposium, pp. 419-422, Oct. 2004.

S. E. Gunnarsson, et al., "Highly Integrated 60GHz Transmitter and Receiver MMICs in a GaAs pHEMT Technology".

IEEE Journal of Solid State Circuits, vol. 40, No. II, pp. 2174-2186, Nov. 2005.

B. A. Floyd, et al., "SiGe bipolar transceiver circuits operating at 60GHz," IEEE Journal of Solid State Circuits, vol. 40, No. 1, pp. 156-167, Jan. 2005.

\* cited by examiner

MILLIMETER-WAVE CASCODE AMPLIFIER GAIN BOOSTING TECHNIQUE

This application claims the benefit of U.S. Provisional Application No. 60/799,175, filed May 10, 2006.

BACKGROUND

The present invention relates generally to millimeter-wave cascode amplifiers, and more particularly, to a gain boosting technique for use with millimeter-wave cascode amplifiers.

The increasing demand for short range, low-cost and high data rate networking solutions drives the research for silicon-based implementation of millimeter-wave (MMW) front end in 59-64 GHz world-wide license-free frequency band. Such applications target multi-gigabit wireless data transfer between hard disks, storage devices, MP3 players, high definition television receivers, and the like. Historically, III-V semiconductors (GaAs, InP) were used to implement millimeter-wave integrated circuits. See K. Lai, et al., "A high performance and low DC power V-band MIMIC LNA using 0.1 µm InGaAs/InAlAs/InP HEMT technology," IEEE Microwave and Guided Wave Letters, Vol. 3, No. 12, pp. 447-449, December 1993; S. E. Gunnarsson, et al., "Highly Integrated 60 GHz Transmitter and Receiver MMICs in a GaAs pHEMT Technology" IEEE Journal of Solid State Circuits, Vol. 40, No. 11, pp. 2174-2186, November 2005; and K. Niahikawa, et al., "Compact LNA and VCO 3-D MMICs using commercial GaAs PHEMT technology for V-band single-chip TRX MMIC," IEEE International Microwave Symposium, pp. 1717-1720, June 2002, Seattle, Wash.

However, silicon-based technologies always have an edge over them in terms of cost and integration. The introduction of silicon-germanium (SiGe) heterojunction bipolar transistors (HBT), such as those disclosed by J. D. Cressler, in "SiGe HBT technology: a new contender for Si-based RE and microwave circuit applications," IEEE Trans. Microwave Theory & Tech., Vol. 46, No. 5, pp. 572-589, May 1998, further enhanced the potential of silicon. 60 GHz transceiver circuits using 200 GHz $F_T$ 0.12 µm SiGe BiCMOS processes have been demonstrated. See S. K. Reynolds, "A 60 GHz superheterodyne downconversion mixer in silicon-germanium bipolar technology," IEEE Journal of Solid Stale Circuits, Vol. 39, No. 11, pp. 2065-2068, November 2004 and B. A. Floyd, et al., "SiGe bipolar transceiver circuits operating at 60 GHz," IEEE Journal of Solid Slate Circuits, Vol. 40, No. 1, pp. 156-167, January 2005.

0.13 µm CMOS has also been used to implement 60 GHz front ends. See C. H. Doan, et al., "Millimeter-Wave CMOS Design," IEEE Journal of Solid State Circuits, Vol. 40, No. 1, pp. 144-155, January 2005 and C. M. Lo, et al., "A Miniature V-band 3-Stage Cascode LNA in 0.13 µm CMOS," IEEE Solid Slate Circuits Conference, pp. 322-323, February 2006, San Francisco, Calif.

However, realization of such blocks using 0.18 µm technology has remained a challenge and needs innovative design techniques. There have been examples of 60 GHz transmitter building blocks such as those disclosed by C. H. Wang, et al., in "A 60 GHz Transmitter with Integrated Antenna in 0.18 µm SiGe BiCMOS Technology," IEEE Solid Stale Circuits Conference, pp. 186-187, February 2006, San Francisco, Calif., for example, using 0.18 µm SiGe BiCMOS process. However, this disclosure focuses on the most critical building block of the receiver, i.e., low noise amplifier development using 0.18 µm SiGe process. It would be desirable to have a simple gain enhancement technique for the millimeter-wave amplifiers to minimize the design complexity.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Disclosed is an exemplary gain boosting technique for millimeter-wave cascode amplifiers. In particular, an exemplary gain boosting technique for a single-stage cascode low noise amplifier (LNA) at 600 Hz is described. The exemplary technique is implemented using a 0.18 μm SiGe process ($F_T$=40 GHz). However, the technique is also effective for CMOS processes with comparable $F_T$. An exemplary gain-enhanced cascode stage was measured to have higher than 9 dB gain with a 1-dB bandwidth above 6 GHz with a DC power consumption of 13 mW. Measurement results indicate higher than 4 dB gain improvement compared to a conventional cascode stage with similar die area and DC power consumption. One cascode stage without any gain boosting may be cascaded with two gain-boosted cascode amplifier stages to implement a three-stage LNA. The measured stable gain is higher than 24 dB at 60 GHz with a 3-dB bandwidth of 3.1 GHz for 25 mW of DC power consumption. It is believed that this is the first 60 GHz LNA with a higher than 20 dB gain using a 0.18 μm SiGe process.

This technique is process independent, and can be used in any cascode structure. Theoretical formulations are derived for the given process and verified using simulations. Characterization of transmission lines is also discussed. Transmission line sections constitute the most part of impedance matching networks. Conductor-backed coplanar waveguide (CB-CPW) transmission lines are used to reduce radiation loss, and to achieve a better grounding throughout the chip. A good correlation between the measurements and the simulations has been observed. The performance of the LNA stages is discussed with and without gain improvement. A single stage cascode LNA has a measured gain of higher than 5 dB at 60 GHz and a greater than 7 GHz 1-dB bandwidth with a DC power consumption of 16.5 mW. The gain-enhanced cascode stage has been measured to have a higher than 9 dB gain at 60 GHz with a 1-dB bandwidth above 6 GHz with 13 mW of DC power consumption. Hence, the disclosed technique provides a –4 dB gain enhancement at 60 GHz for a single-stage cascode with similar area and DC power consumption. The measured output P1dB is –3.5 dBm. The simulated noise figure is <0.5 dB higher than that of a conventional design.

A three-stage LNA may be implemented by cascading one conventional and two gain-enhanced cascode stages. Measurement results for an exemplary three-stage LNA indicate a stable gain of 24 dB at 60 GHz with a 3.1 GHz 3-dB bandwidth with 26 mW DC power consumption. The measured noise figure is 7.9 dB at 60 GHz. This is the first 60 GHz LNA with a higher than 20 dB gain using a 0.18 μm SiGe BiCMOS process. Thus, implementation of a low noise amplifier in a 0.18 sm SiGe process using gain-boosting circuit techniques is achieved.

Cascode Gain Boosting Technique

Figure 1:
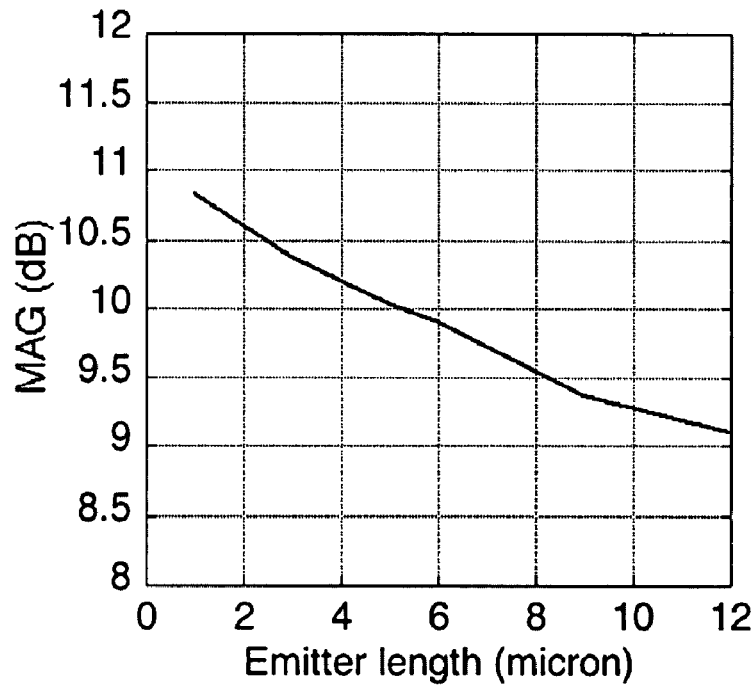
FIG. 1 is a graph that illustrates the simulated maximum available gain of a single cascode stage with different emitter lengths of the transistors at 60 GHz.

Referring to the drawing figures, a cascode structure, stage or device (FIG. 2) was chosen as the basic LNA stage. The simulated maximum available gain (MAG) (See, D. M. Pozar, *Microwave Engineering*, Wiley and Sons, 1998) of the cascode device at 60 GHz for different emitter lengths of the HBTs is shown in FIG. 1. They correspond to their optimum current densities (corresponding to maximum $F_T$ as given by the models), assuming identical transistors in the common-emitter (CE) and common-base (CB) stages and a 3.3V power supply (1.5V across the CE stage and 1.8V across the CB stage).

As is shown in FIG. 1, the MAG of a single cascode stage is approximately 9-10.5 dB at 60 GHz with the variation of the emitter length. Also, 50 ohm matching for maximum power gain increases the noise figure from its minimum ($NF_{min}$) value if the optimum noise matching conditions do not match with power matching conditions. To minimize this effect, medium sized HBTs (emitter length 6 μm) were chosen.

Mismatches in the matching networks, as well as transmission line losses reduce the actual available gain from a cascode stage. Thus, different available gain boosting techniques were evaluated. Gain boosting of a common gate (CG) LNA has been reported at a much lower RF frequency. See D. J. Allstot, et al., "Design Considerations for CMOS Low-Noise Amplifiers," *Radio Frequency Integrated Circuits Symposium*, pp. 97-100 June 2004, Fort Worth, Tex. However, this technique requires a number of additional circuit components, and even then is not suitable for the cascode structure preferred in 60 GHz LNAs. There is also a report of cascode gain boosting at lower RF frequencies, where a negative resistance generating circuit (MOS with gate inductance) is connected to the drain of the common-source (CS) MOS. See S. Asgaran et al., "A Novel Gain Boosting Technique for Design of Low Power Narrow-Band RFCMOS LNAs," *IEEE Northeast* Workshop on Circuits and Systems, pp. 293-296 June 2004, Montreal, Canada. However, that requires a separate transistor with additional biasing, and the bandwidth is narrow (due to the tuned nature of the negative resistance generating circuit) with inherent instability with higher oscillation possibility (due to the parasitic effects at 60 GHz).

Figure 2:
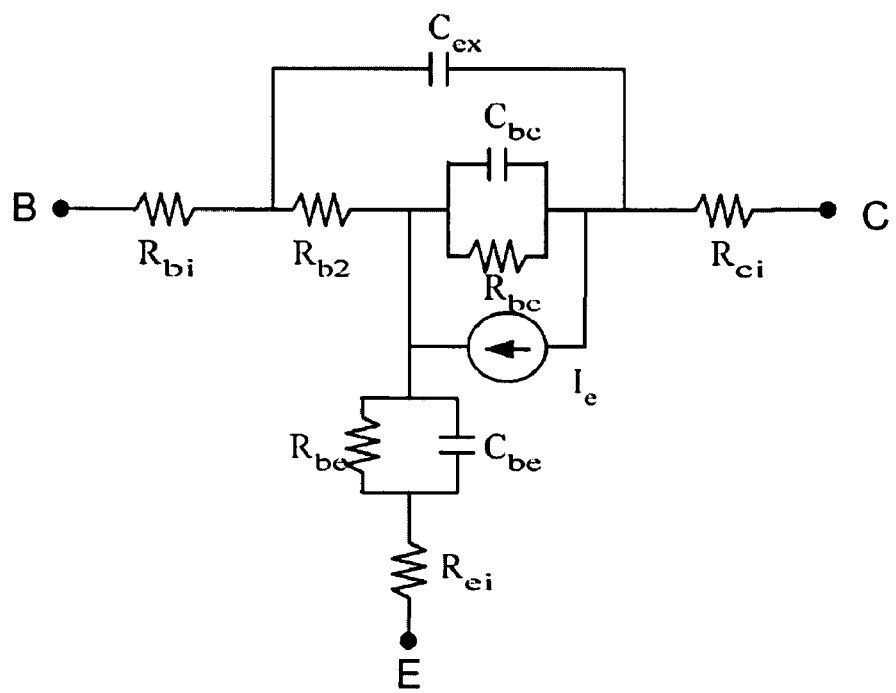
FIG. 2 illustrates an exemplary Gummel-poon based HBT small-signal model.

Disclosed herein is a gain boosting technique that needs just one additional inductive feedback element to facilitate layout and design complexity issues. This technique is process (SiGe/CMOS) independent, and can be used for any cascode stage as described herein. A simple small-signal HBT model was considered for theoretical formulations. See M. Rudolph, et al., "Direct Extraction of HBT Equivalent-Circuit Elements," *IEEE Trans. Microwave Theory & Tech.*, Vol. 47, No. 1, pp. 82-84, January 1999, and P. Sen, et al., "A Broadband, Small-Signal SiGe HBT Model for Millimeter-Wave Applications," *European GaAs and other Compound Semiconductors Application Symposium*, pp. 419-422, October 2004, Amsterdam, The Netherlands. FIG. 2 shows a Gummel-poon based model of an exemplary cascode stage with corresponding parameters.

Common Base Stage with Base Inductance

Figure 3:
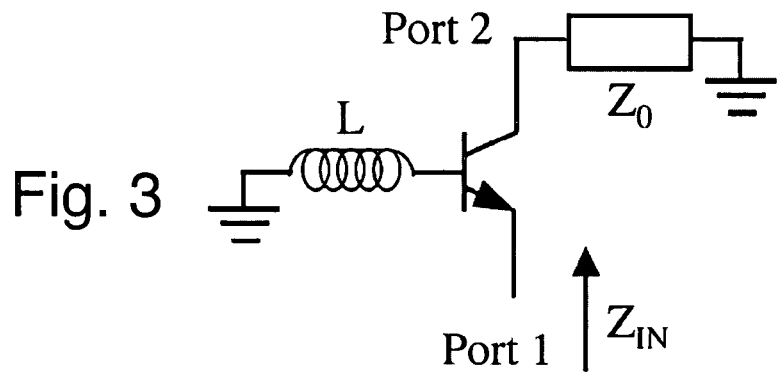
FIG. 3 illustrates a single CB stage with a shorted inductance in the base.

A single common base (CB) stage with a shorted inductance (L) in the base is shown in FIG. 3. The input impedance (IN) can be determined in terms of the two-port z-parameters and characteristic impedance ($Z_0$) as follows:

$$Z_{IN} = Z_{11} - \frac{Z_{12} \times Z_{21}}{Z0 + Z_{22}} \qquad (1)$$

The values of the z-parameters are defined as $$Z_{ij} = z_{ij0} + j\omega L \text{ for } i=1,2; j=1,2 \qquad (2)$$

where, $Z_{ij}$ defines the corresponding z-parameters in the absence of the inductance L and to is the frequency in radian. Hence, $Z_{IN}$ is determined as $$Z_{IN} = Z_{IN0} + j\omega L, \qquad (3)$$
where
$$\frac{A \times j\omega L}{B^2 + B \times j\omega L}$$
where, $$A = \left[ Z_0 + R_{ci} + \frac{1-a}{j\omega \times (C_{ex} + C_{bc})} \right] \times \qquad (4)$$
$$\left[ Z_0 + R_{ci} + \frac{1}{j\omega \times (C_{ex} + C_{bc})} - \frac{C_{bc} + R_{b2}}{C_{ex} + C_{bc}} \right]$$

-continued $$B = \left[Z_0 + R_{ci} + R_{bi} + \frac{1}{j\omega \times (C_{ex} + C_{bc})}\right] \quad (5)$$

Figure 4A:
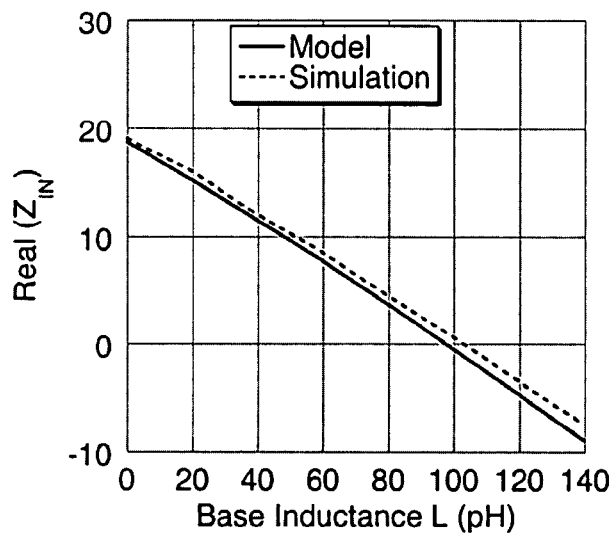
FIGS. 4a and 4b are graphs showing variation of real and imaginary parts, respectively, of $Z_{IN}$ with base inductance L.
Figure 4B:
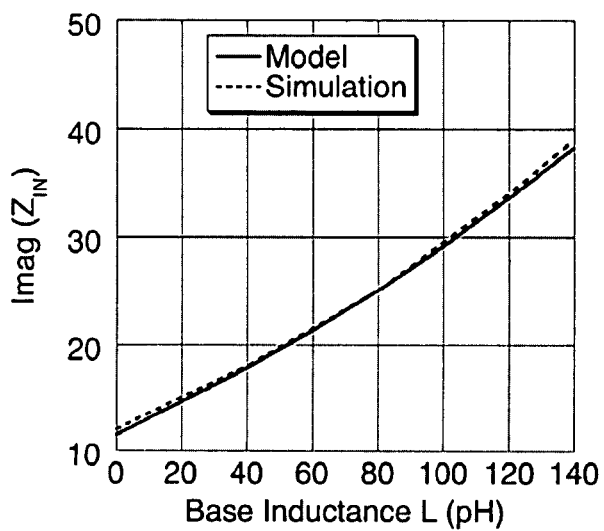

The model parameters are extracted from device (emitter length=6 μm) simulations and the corresponding real and imaginary parts of $Z_{IN}$ are plotted for different values of base inductance (L). FIGS. 4a and 4b show these plots along with the corresponding simulated values of $Z_{IN}$.

As is shown in FIGS. 4a and 4b, the real part of the input impedance of the CB stage decreases, and the imaginary part of the input impedance of the CB stage increases with increasing base inductance (L) in an approximately linear fashion. This impedance acts as the load for the CE transistor in the cascode stage. To evaluate the effect of the base inductance (L), the voltage gain of the CE transistor with this varying load impedance is analyzed below.

Voltage Gain of the Common Emitter Stage

The voltage gain of the common emitter (CE) stage can be defined in terms of its z-parameters and the load impedance ($Z_L$) as follows:

$$A_V = Z_{11} - \frac{Z_{21} \times Z_L}{\Delta Z + Z_{11} + Z_L} \quad (6)$$

where, $$\Delta Z = Z_{11} \times Z_{22} - Z_{12} \times Z_{21} \quad (7)$$

Figure 5:
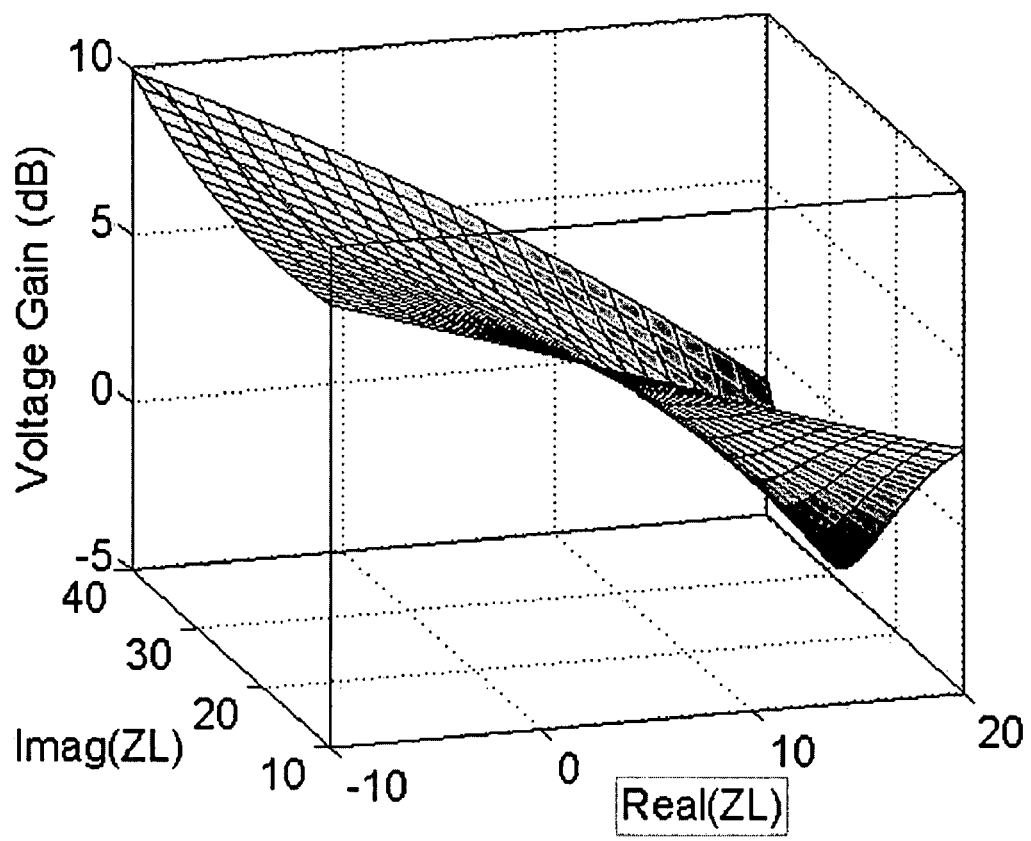
FIG. 5 is a graph showing voltage gain of the given CE stage for different load impedances.
Figure 6:
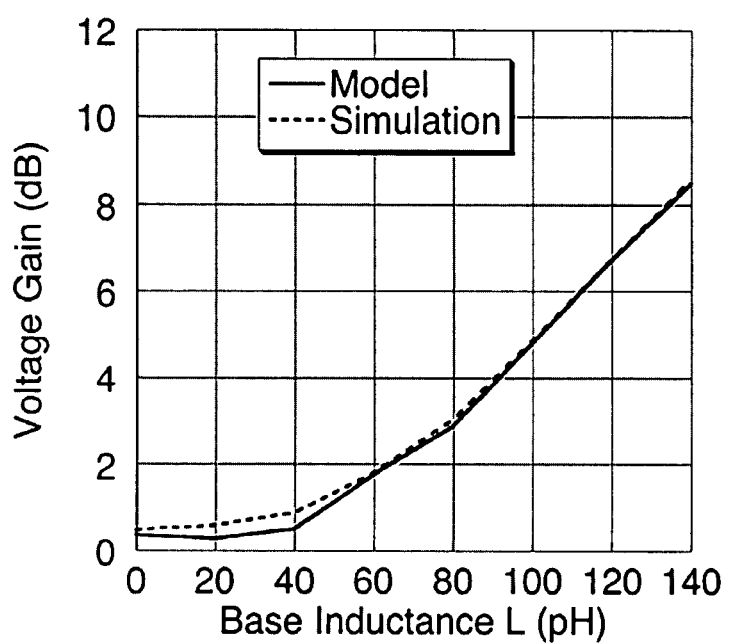
FIG. 6 is a graph showing voltage gain of the given CE stage with base inductance (L) in the CB stage.

The input impedance of the CB stage acts as the load impedance of the CE stage. FIG. 5 plots the voltage gain of the CE stage for different real and imaginary values of the $Z_t$ over the entire range of input impedance of CB stage as shown in FIGS. 4a and 4b (VCE=1.8V, Ic=4.2 mA). FIG. 6 shows the voltage gain at the specific impedances corresponding to the base inductance values of the CB stage. Simulated voltage gain is also plotted to compare with the theoretical values, and they match reasonably well.

FIGS. 5 and 6 illustrate that the voltage gain of the CE stage increases rapidly with the decrease in the real part of the load impedance, which, in turn, is caused by the base inductance in the CB stage. The power gain of the cascode increases due to the increase in the voltage gain of the CE stage. However, the voltage gain of the CB stage reduces (by a smaller extent), thus limiting the gain-enhancement using this technique as shown in the next subsection. Due to the complexity of the theoretical formulation of the power gain of the cascode as a function of CB stage base inductance (L), simulation results are considered below as the simulation trends match well with theoretical trends (from FIGS. 4a, 4b and 6).

Cascode Gain Enhancement

Figure 7:
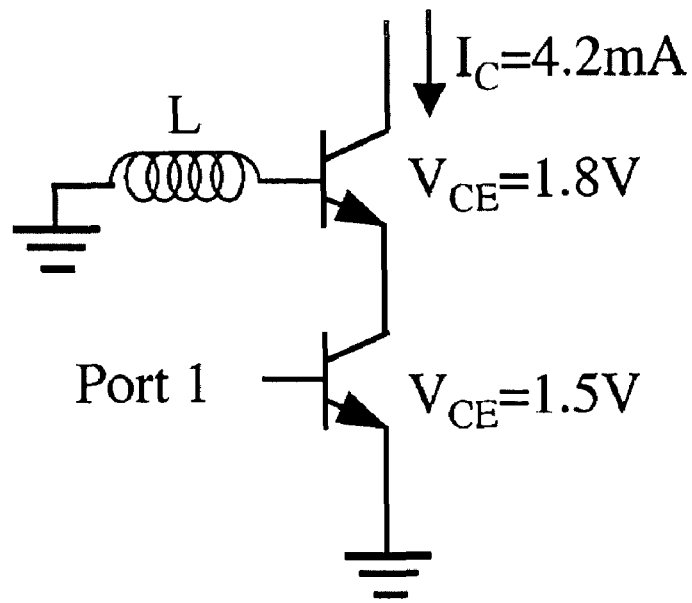
FIG. 7 is a schematic showing an exemplary gain-enhanced cascode core.

FIG. 7 shows a schematic of a cascode core with the base inductance in the CB stage. The emitter length is 6 μm, and the DC conditions (derived from conditions of higher gain and lower DC power consumption) are shown in FIG. 7. The variation of MAG and the different s-parameters at 60 GHz are plotted with the variation of base inductance in FIGS. 8 and 9a and b, respectively.

Figure 8:
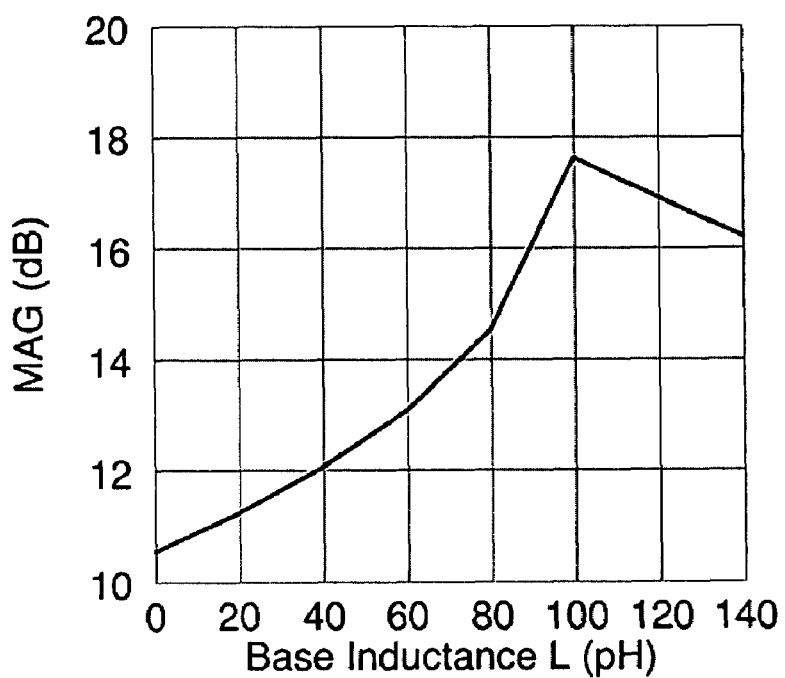
FIG. 8 is a graph showing variation of simulated MAG of the cascode core shown in FIG. 7 with a base inductance at 60 Ghz.

FIG. 8 shows a significant improvement of MAG of the cascode core with increasing inductance at the base of the CB transistor. This is due to the increase in voltage gain of the CE transistor. However, at higher values of L, the MAG decreases by a small amount due to the reduction in gain of the CB stage. Hence, 90 pH was chosen as the optimum base feedback inductance to enhance the gain of this particular cascode core. This enhances the simulated MAG by approximately 5 dB for the same power consumption.

Figure 9A:
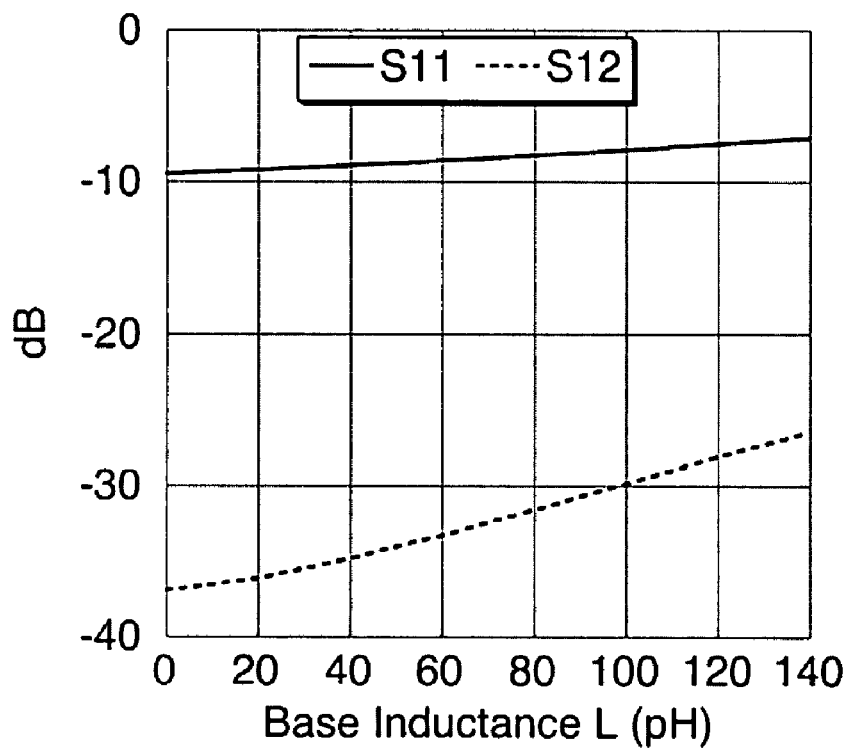
FIGS. 9a and 9b are graphs showing variation of simulated s-parameters of the cascode core with the base inductance at 60 GHz.
Figure 9B:
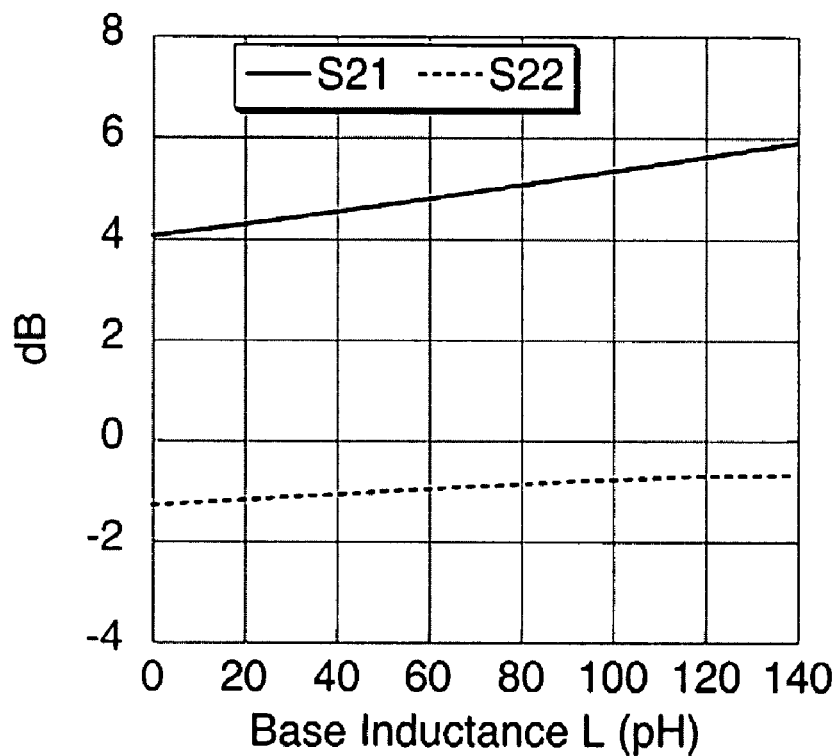

FIGS. 9a and 9b show an increasing trend in all the s-parameters with increasing L. This signifies a reduction in the overall stability factor (K) of the cascode stage, resulting in higher instability. Hence, the current consumption of the gain enhanced cascode stage is reduced to increase the inherent stability factor.

Transmission Line and Matching Network Characterization

Figure 10A:
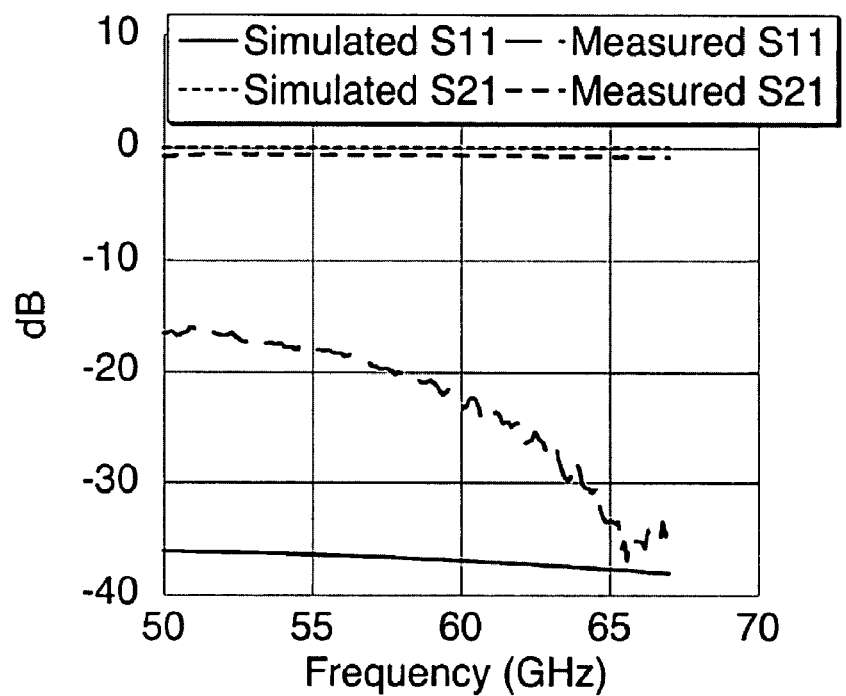
FIG. 10a is a graph showing measured and simulated s-parameters of a 50 ohm 60 GHz $I_g/4$ CB-CPW transmission line.
Figure 10B:
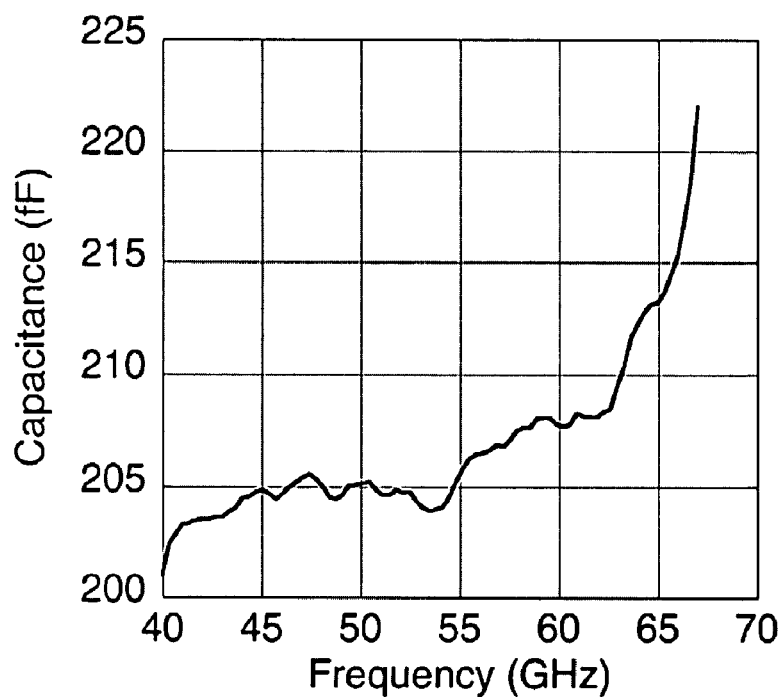
FIG. 10b is a graph showing measured capacitance of a 201.6 fF capacitor.

The input and the output matching networks of the single cascode stages, as well as the interstage matching networks of a multi-stage LNA are realized with conductor-backed coplanar waveguide (CB-CPW) transmission lines in order to minimize the radiation losses, when compared to a microstrip configuration. The base inductance in the cascode device is used to minimize the length of the transmission line. The transmission lines are characterized to match the measurements with the corresponding simulations. FIGS. 10a and 10b show simulated and the measured s-parameters of a 60 GHz 50 ohm $l_g/4$ CB-CPW transmission line and the measured capacitance of a 201.6 fF capacitor, used in the matching circuits as DC block components.

Figure 11A:
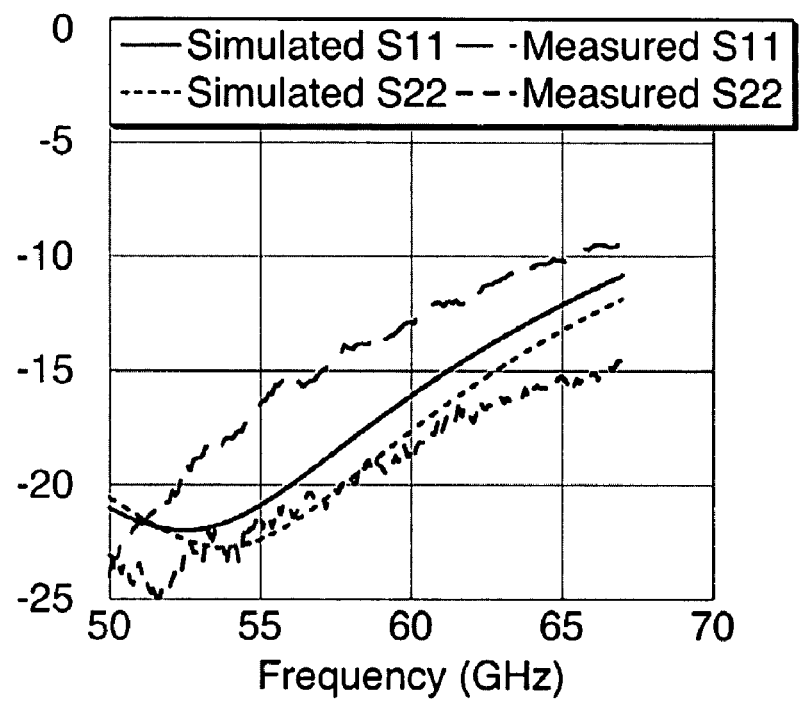
FIGS. 11a and 11b are graphs showing measured and simulated s-parameters of the input matching network of the cascode stage without gain boosting.
Figure 11B:
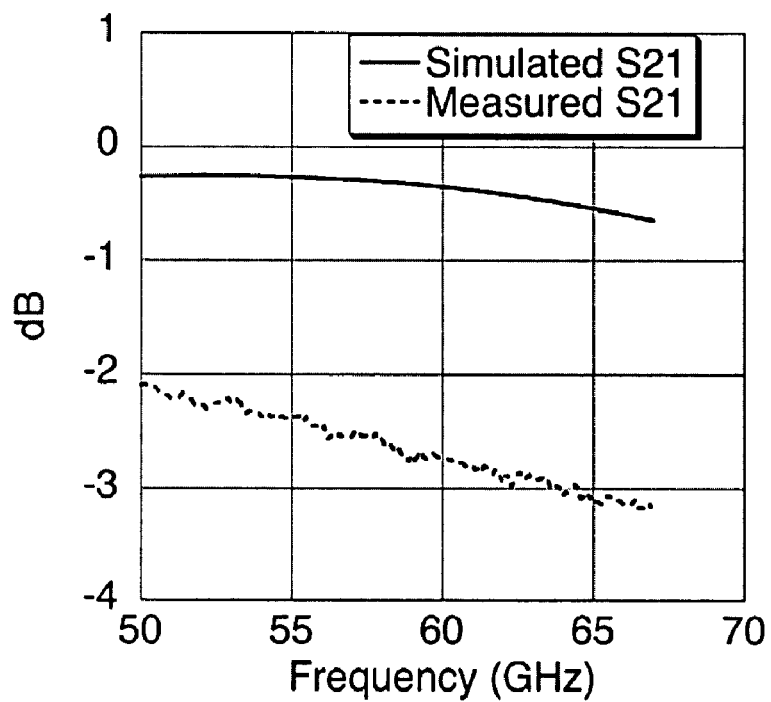

Test structures for input and output matching networks of single-stage LNAs with and without gain enhancement were measured. The matching characteristics correspond relatively well with the simulations. However, the insertion loss is higher by a significant amount as the resistive losses are not entirely captured by the simulation models (as evident from FIGS. 10a and 10b). FIGS. 11a and 11b show measured and simulated s-parameters of the input-matching network of the LNA cascode stage without gain boosting (including the effect of bond pads). The difference between measured and simulated $S_{21}$ is primarily caused by the resistive and substrate losses in the transmission lines.

LNA Implementation

Figure 12A:
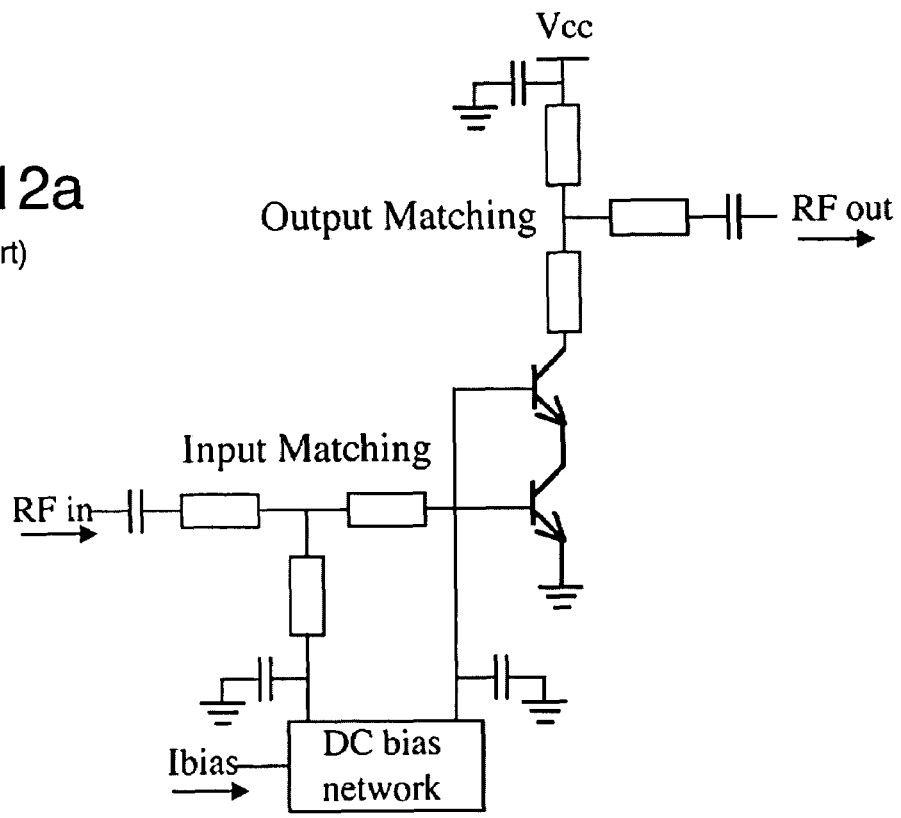
FIG. 12a shows a schematic of the basic single-stage LNA.
Figure 12B:
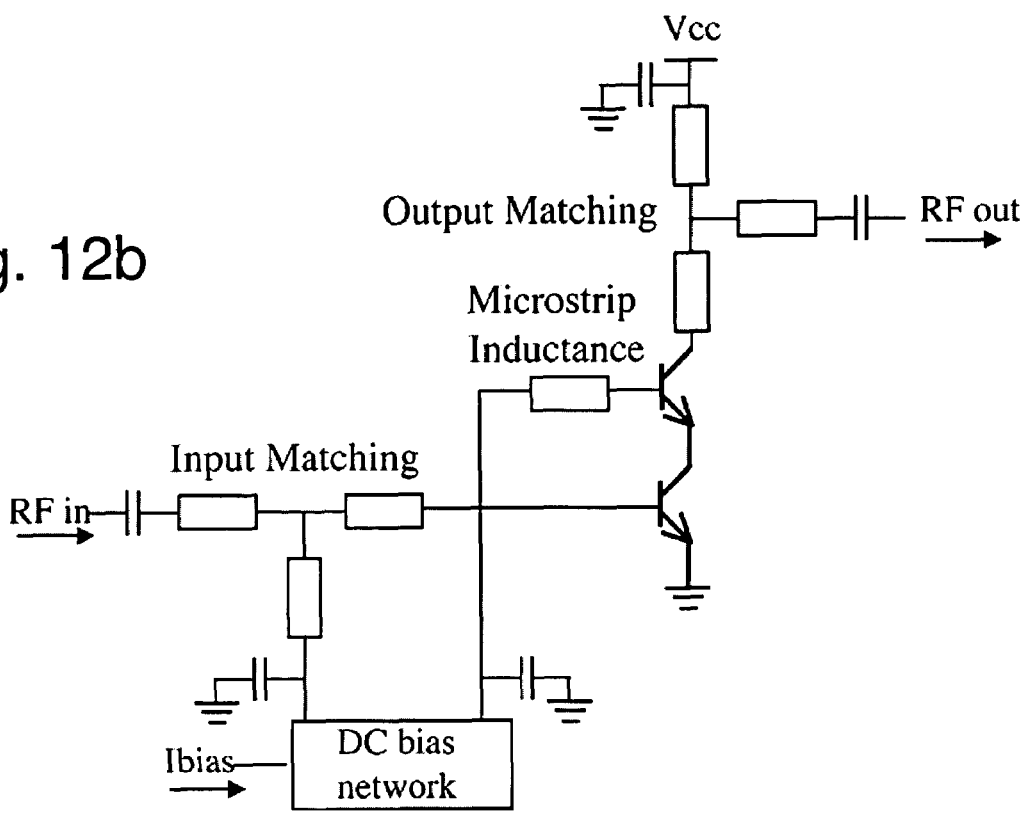
FIG. 12b show s the schematic of the gain-enhanced single-stage LNA.

The exemplary gain boosting technique discussed above was implemented in an exemplary single-stage cascode LNA. A microstrip transmission line is used to realize the feedback inductance at the base of the CB transistor in the cascode configuration. FIG. 12a shows a schematic of a conventional single-stage LNA and FIG. 12b shows the schematic of an exemplary gain-enhanced single-stage LNA. The shorted stubs in the input and the output matching networks are used to provide base bias and supply voltage bias, respectively. Similar matching networks were implemented as discussed above. The device size is selected to minimize the noise figure for a 50 ohm input match, as well as to minimize the DC power dissipation for a given gain. The selected emitter length is 6 μm. An exemplary single-stage cascode LNA occupies an area of 0.86 mm×0.83 mm, and the gain-enhanced LNA occupies 1.05 mm×0.71 mm.

Figure 13A:
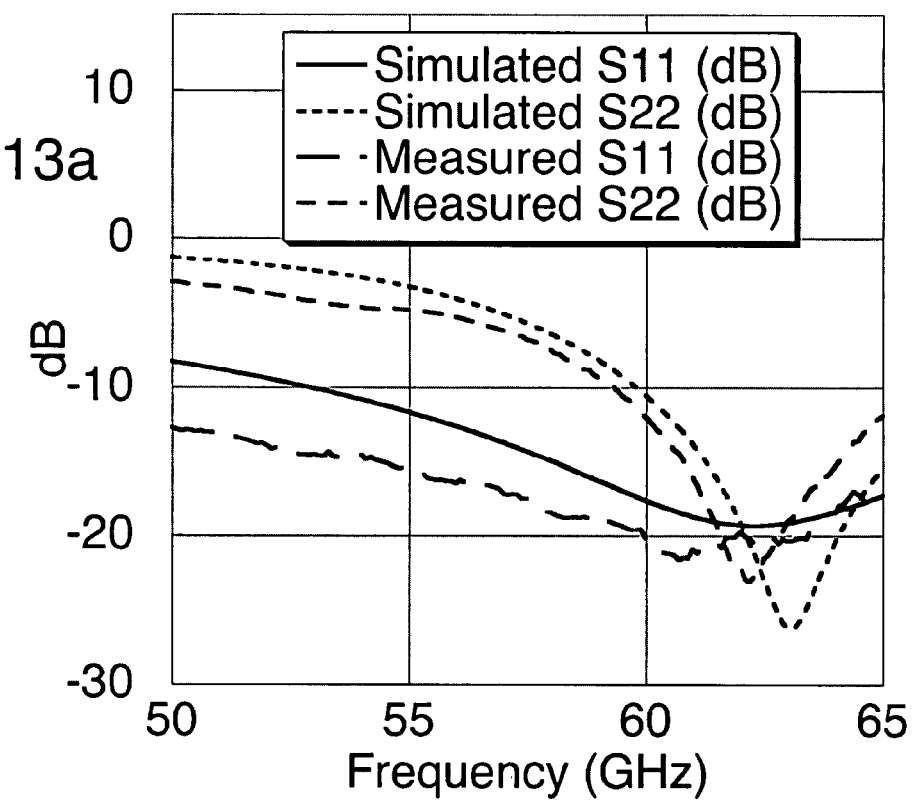
FIGS. 13a and 13b are graphs showing measured and simulated s-parameters of the single-stage cascode LNA (5 mA from 3.3V supply) without gain enhancement.
Figure 13B:
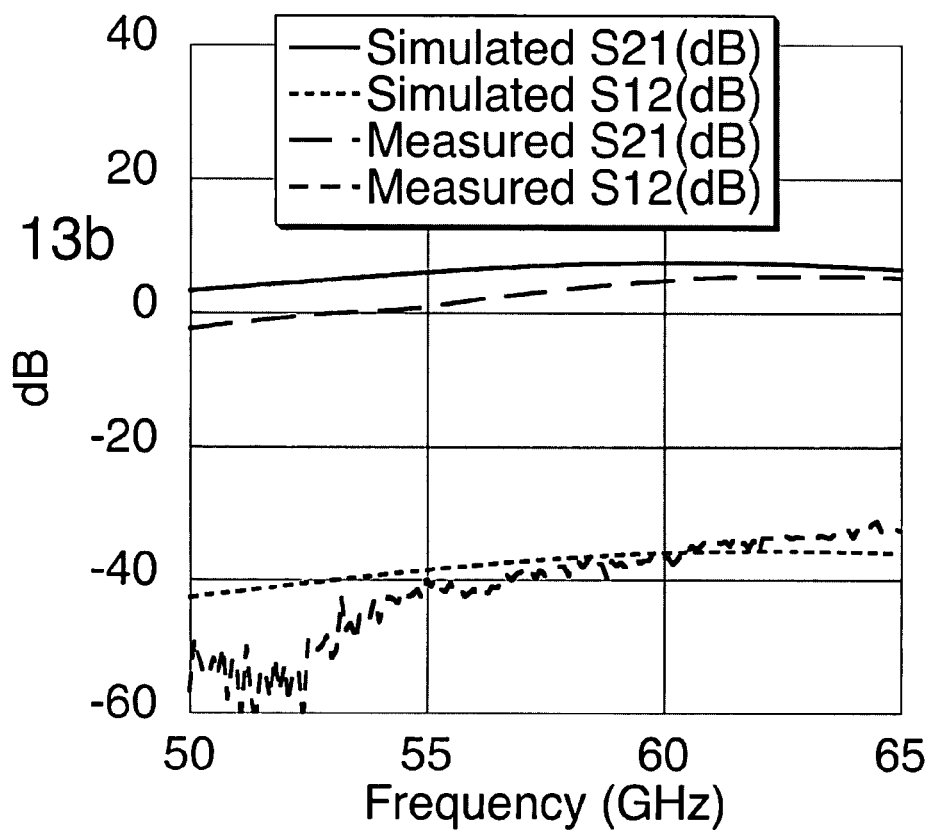
Figure 14A:
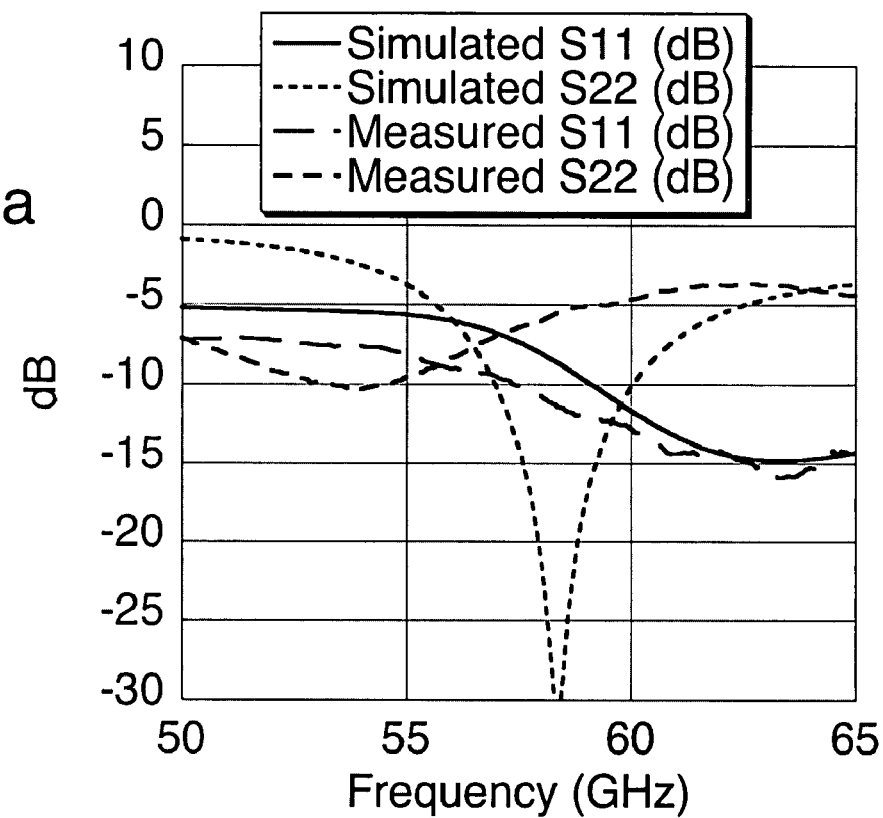
FIGS. 14a and 14b are graphs showing measured and simulated s-parameters of the single-stage cascode LNA with feedback in ductance (3.5 mA from 3.7V supply)
Figure 14B:
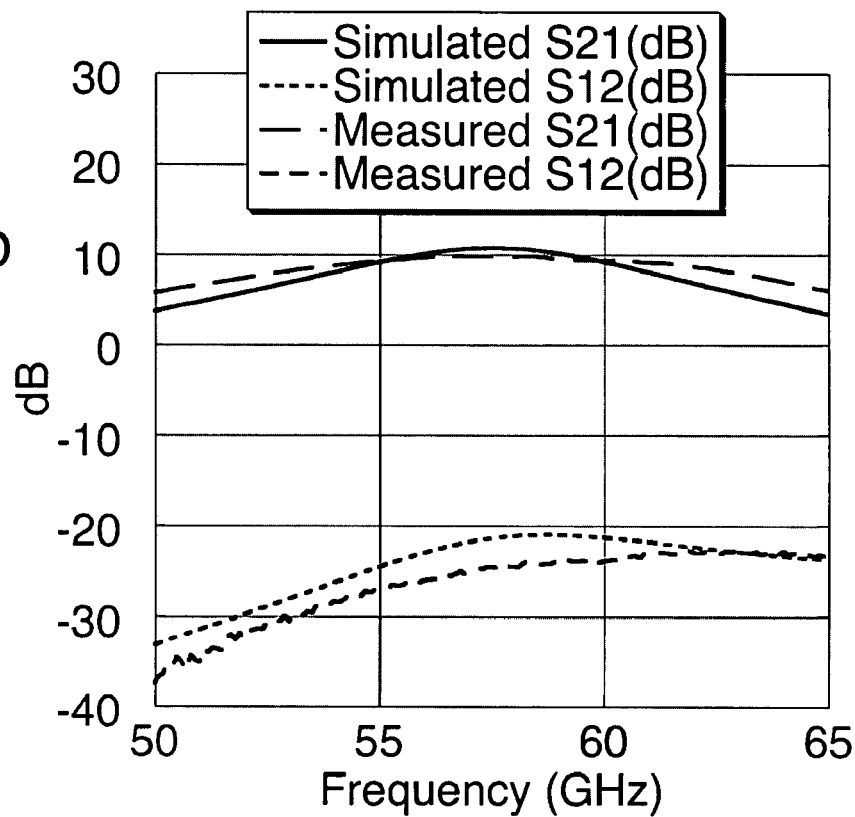

FIGS. 13a and 13b are graphs showing measured and simulated s-parameters of the single-stage cascode LNA (5 mA from 3.3V supply) without gain enhancement. The cascode stage without gain-boosting was measured to have a higher than 5 dB gain at 60 GHz band with a 1-dB bandwidth above 7 GHz as shown in FIGS. 13a and 13b with a DC power consumption of 16.5 mW (5 mA from 3.3V supply). The input and output matching correspond well with the simulation. Lossy transmission lines in the matching networks (discussed above) cause a −2 dB difference between the measured and the simulated gains ($S_{21}$). The gain-enhanced cascode LNA was measured to have a higher than 9 dB stable gain (K factor>1.4 over the frequency range) with a 1 dB bandwidth greater than 6 GHz as shown in FIGS. 14a and 14b for a DC power consumption of 13 mW (3.5 mA from a 3.7V supply). Hence, the gain enhancement technique results in greater than 4 dB gain improvement at 60 GHz for a similar area and DC power consumption. The shift in the output matching is primarily caused by the parasitic inductance (~25-30 pH) in the feedback path and also higher than predicted inductive effects.

Figure 15:
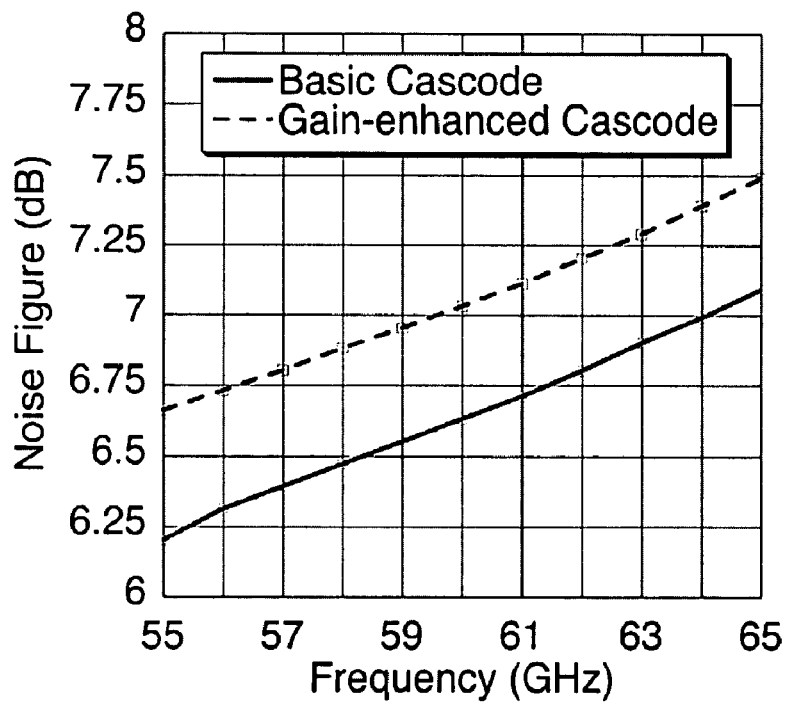
FIG. 15 is a graph showing measured noise figure of the basic cascode stage and gain-enhanced cascode stage.

The simulated noise figure of the gain-enhanced cascode stage is slightly higher (~0.5 dB) than that of the basic cascode stage. FIG. 15 compares the simulated noise figures of the two different configurations.

Figure 16:
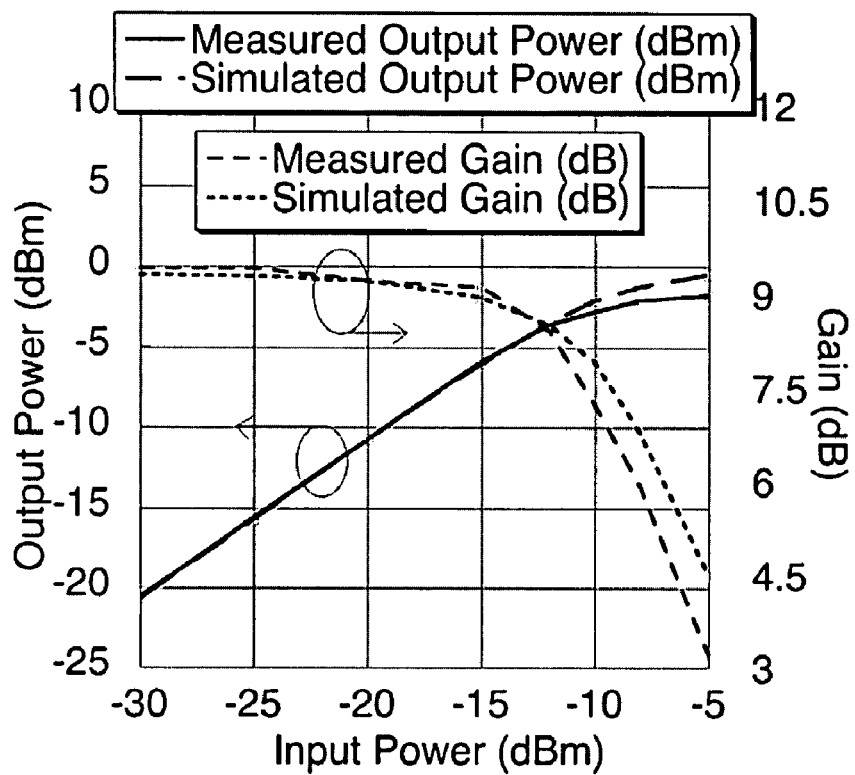
FIG. 16 is a graph showing simulated and measured linearity performance of the gain-enhanced cascode stage.

The linearity measurements show similar output 1 dB compression point for two different configurations. The measured output P1dB is approximately −3.5 dBm. FIG. 16 shows the measured and simulated linearity of the gain-enhanced cascode stage at 60 GHz. They correspond well with each other.

Figure 17:
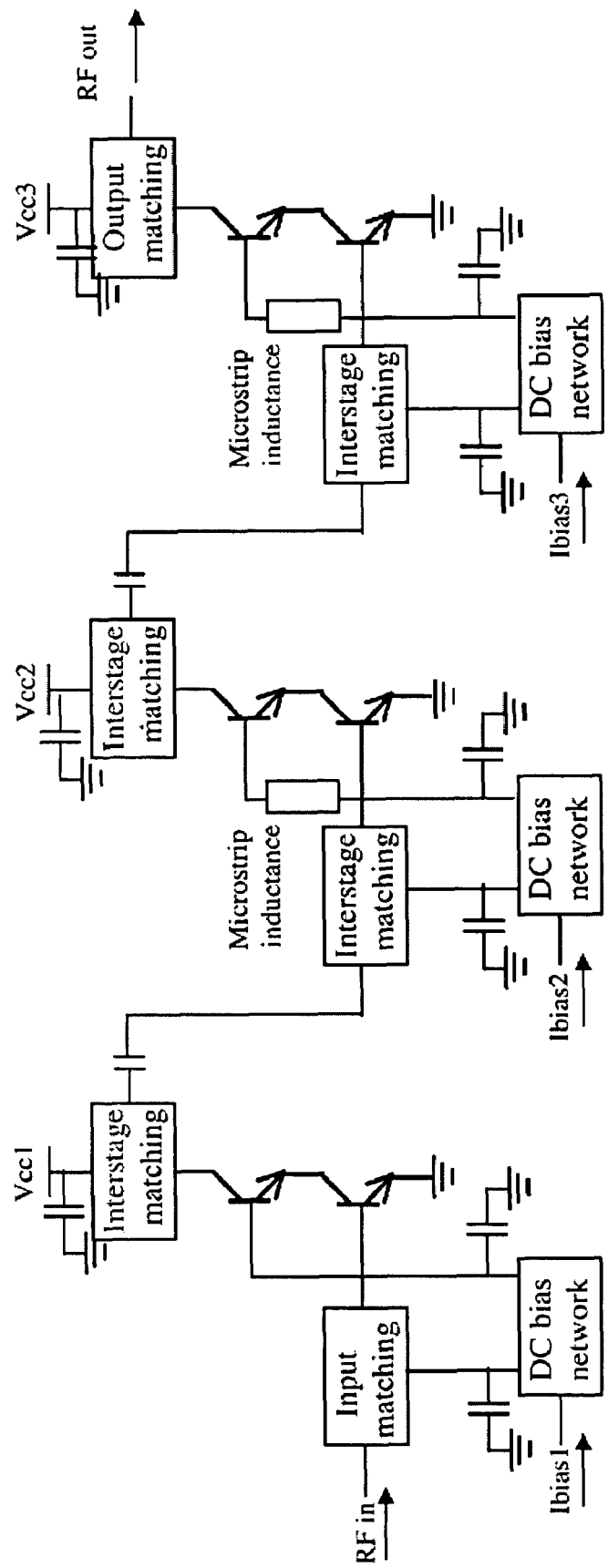
FIG. 17 show s a schematic of an exemplary three-stage LNA.

One basic cascode stage and two gain-enhanced cascode stages may be cascaded to implement a three-stage LNA that can be used in the 60 GHz front-end. The gain boosting technique is not applied to the first stage in order to minimize the noise figure of the integrated LNA. FIG. 17 shows a schematic of the 3-stage LNA. An exemplary die occupies an area of 2.05 mm×0.71 mm.

Figure 18A:
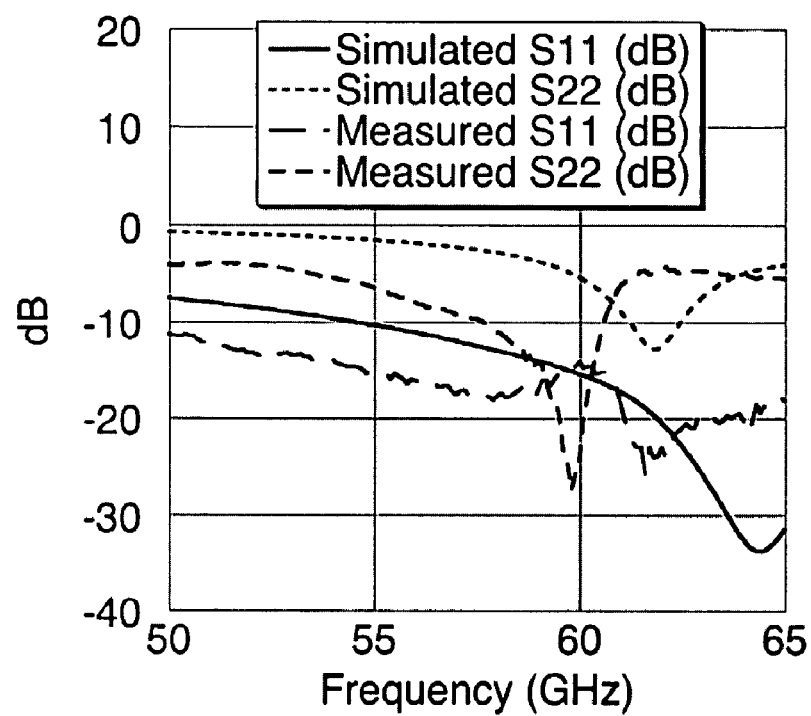
FIGS. 18a and 18b are graphs showing measured s-parameters of the three-stage LNA (DC power consumption=25 mW)
Figure 18B:
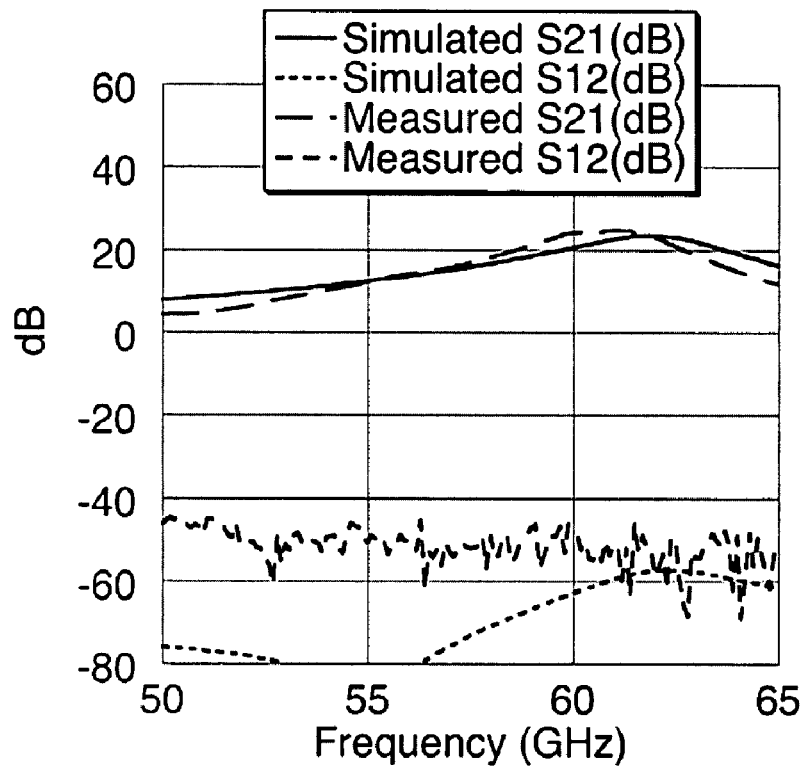
Figure 19:
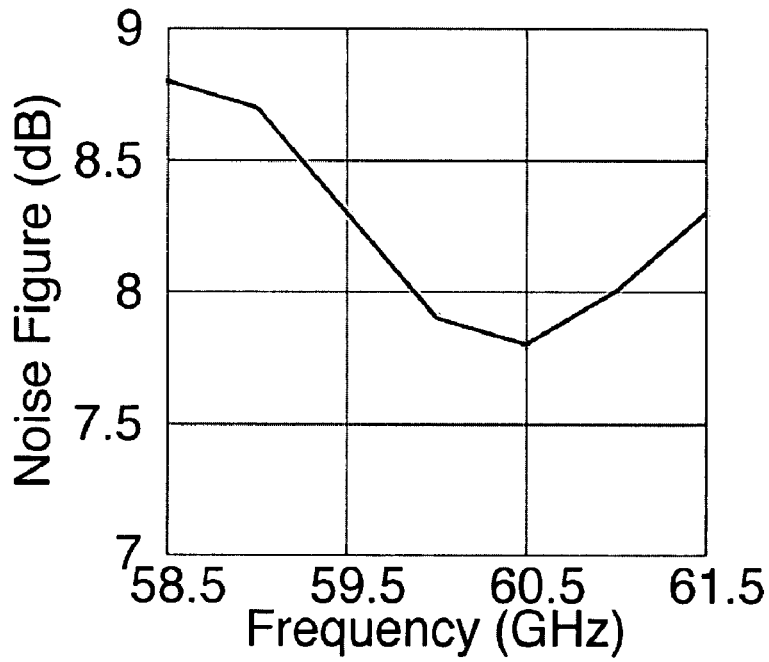
FIG. 19 is a graph showing the measured noise figure of the three-stage LNA.

The measurement results show a higher than 24 dB stable gain (K factor>4 at the frequency band) at 60 GHz with a 3.1 GHz 3-dB bandwidth with 25 mW of DC power consumption. The measured noise figure is 7.9 dB at 60 GHz. The simulated output P1dB is −3.5 dBm and that corresponds to the measured output P1dB of the gain-enhanced LNA. This is the first 60 GHz LNA with a higher than 20 dB gain using a 0.18 μm SiGe BiCMOS process. The measured and simulated s-parameters are shown in FIG. 18a and 18b. The measured noise figure is shown in FIG. 19.

Table 1 compares the performance the exemplary LNA shown in FIG. 17 with reported silicon-based 60 GHz LNAs.

TABLE 1

SILICON-BASED 60 GHz LNA PERFORMANCE COMPARISON

| Process [Ref] | Topology | Frequency (GHz) | Gain (dB) | Noise Figure | Power consumption (mW) | Output P1dB (dBm) |
|---|---|---|---|---|---|---|
| 0.12 μm SiGe HBT | 1-stage CG + cascode | 56-64 | 15 | 4.5 | 11 | −5@ 61 GHz |
| 0.13 μm CMOS | 3-stage cascode | 51-57 | >20 | 8 | 72 | 1.8@ 56 GHz |
| 0.13 μm CMOS | 3-stage cascode | 51-65 | 12 | 8.8 | 54 | 2@ 60 GHz |
| 0.18 μm SiGe HBT | 3-stage cascode (with feedback inductor) | 58-63 | >20 | 7.9 | 25 | −3.5@ 60 GHz |

Figure 20:
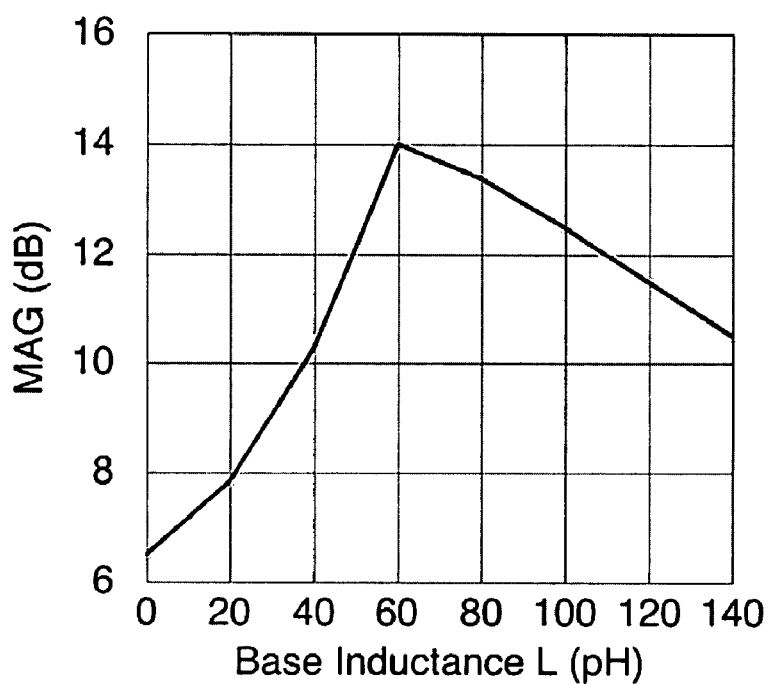
FIG. 20 is a graph showing the simulated MAG of the CMOS cascode core with increasing base inductance at common-gate stage at 60 GHz ($V_{DD}$=2.4V, $I_D$=6.8 mA, device size=40×1 µm/0.13 µm

The gain boosting technique may also be applied to a CMOS cascode core using a 0.13 μm CMOS process, for example. FIG. 20 shows the simulate enhancement of MAG with different lengths of the inductor at the gate of an exemplary cascode device. It shows a comparable enhancement as shown in FIG. 8 for SiGe HBT device.

Thus, a gain boosting technique for use with millimeter-wave cascode amplifiers has been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. Cascode core apparatus comprising:
   a common emitter transistor;
   a common base transistor cascaded with the common emitter transistor; and
   an inductance having a first end coupled to a base of the common base transistor and having a second end coupled to a capacitively coupled RF ground, which inductance increases the maximum available gain of the apparatus in a predetermined bandpass frequency range, and wherein the inductance sets the predetermined bandpass frequency range.

2. The apparatus recited in claim 1 which further comprises:
   an output matching network having an RF output coupled between a voltage source and the common base transistor;
   an input matching network having an RF input that is coupled to a base of the common emitter transistor; and
   a DC bias network coupled to the input matching network.

3. The apparatus recited in claim 1 wherein the inductance comprises a microstrip inductance.

4. The apparatus recited in claim 3 wherein the inductance comprises a lumped inductance.

5. The apparatus recited in claim 3 wherein the inductance comprises a coplanar waveguide inductance.

6. The apparatus recited in claim 2 wherein the inductance comprises a microstrip inductance.

7. The apparatus recited in claim 1 further comprising:
   an output matching network having an RF output coupled to a collector of the common base transistor;
   an input matching network having an RF input that is coupled to a base of the common emitter transistor, and
   a DC bias network for providing bias for the common base and common emitter transistors;
   which apparatus comprises a one-stage gain-boosted cascode amplifier stage.

8. The apparatus recited in claim 7 which is configured to operate at a frequency range between 57 and 64 GHz.

9. The apparatus recited in claim 7 further comprising:
   an unboosted one-stage cascode amplifier stage coupled to an input of the gain-boosted cascode amplifier stage; and
   a second one-stage gain-boosted cascode amplifier stage coupled to an output of the one-stage gain-boosted cascode amplifier stage.

10. The apparatus recited in claim 9 which is configured to operate at a frequency range between 57 and 64 GHz.

11. A method for providing gain boosting in a cascode amplifier, comprising
   fabricating a cascode amplifier comprising a common emitter transistor, a common base transistor cascaded with the common emitter transistor, an output matching network having an RF output coupled to a collector of the common base transistor, an input matching network having an RF input that is coupled to a base of the common emitter transistor, and a DC bias network for providing bias for the common base and common emitter transistors; and
   coupling a first end of an inductance to a base of the common base transistor and coupling a second end of the inductance to a capacitively coupled RF ground, so as to increase the gain of the cascode amplifier in a predetermined bandpass frequency range, and wherein the inductance sets the predetermined bandpass frequency.

12. The method recited in claim 11 wherein the gain boosting of the cascode amplifier is achieved without increasing the area of the amplifier and without increasing the DC power consumption.

13. The method recited in claim wherein fabricating the cascode amplifier is achieved using a SiGe process.

14. The method recited in claim 11 wherein fabricating the cascode amplifier is achieved using a 0.18 μm SiGe process.

15. The method recited in claim 11 wherein fabricating the cascode amplifier is achieved using a CMOS process.

16. The method recited in claim 10 wherein fabricating the cascode amplifier is achieved using a 0.13 μm CMOS process.

17. The method recited in claim 11 wherein the cascode amplifier comprises a one-stage gain-boosted cascode amplifier stage, and wherein the method further comprises:

fabricating a second cascode amplifier comprising a common emitter transistor, a common base transistor cascaded with the common emitter transistor, an output matching network having an RF output coupled to a collector of the common base transistor, an input matching network having an RF input that is coupled to a base of the common emitter transistor, and a DC bias network for providing bias for the common base and common emitter transistors, which second cascode amplifier comprises an unboosted one-stage cascode amplifier stage;

coupling the unboosted one-stage cascode amplifier stage to an input of the gain-boosted cascode amplifier stage;

fabricating a third cascode amplifier comprising a common emitter transistor, a common base transistor cascoded with the common emitter transistor, an output matching network having an RF output coupled to a collector of the common base transistor, an input matching network having an RF input that is coupled to a base of the common emitter transistor, and a DC bias network for providing bias for the common base and common emitter transistors;

coupling an inductance between a base of the common base transistor and a capacitively coupled HF ground of the third cascode amplifier so as to form a second gain boosted cascode amplifier; and coupling the second gain boosted cascode amplifier to an output of the gain-boosted cascode amplifier.

18. The method recited in claim 17 wherein fabricating is achieved using a SiGe process.

19. The method recited in claim 17 wherein fabricating is achieved using a CMOS process.

20. The method recited in claim 17 wherein fabrication produces an amplifier structure that operates at a frequency range between 57 and 64 GHz.

* * * * *